(12) United States Patent
Petzold et al.

(10) Patent No.: US 7,265,426 B2
(45) Date of Patent: Sep. 4, 2007

(54) HIGH-VOLTAGE MOS TRANSISTOR AND CORRESPONDING MANUFACTURING METHOD

(75) Inventors: Klaus Petzold, Reutlingen (DE); Steffi Lindenkreuz, Reutlingen (DE); Joachim Strauss, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 162 days.

(21) Appl. No.: 11/191,894

(22) Filed: Jul. 27, 2005

(65) Prior Publication Data

US 2006/0022294 A1   Feb. 2, 2006

(30) Foreign Application Priority Data

Jul. 27, 2004  (DE)  ............. 10 2004 036 387

(51) Int. Cl.
*H01L 29/94* (2006.01)
(52) U.S. Cl. .............. 257/401; 257/341; 257/133; 257/E29.256; 438/284; 438/286
(58) Field of Classification Search ............ 257/401
See application file for complete search history.

(56) References Cited

U.S. PATENT DOCUMENTS 6,236,068 B1 * 5/2001 Feiler .............. 257/133

OTHER PUBLICATIONS

Bassin et al., *High-Voltage Device for 0.5-μm Standard CMOS Technology*, IEEE Electron Device Letters, vol. 21, No. 1, Jan. 2000, pp. 40-42.

* cited by examiner

*Primary Examiner*—Tu-Tu V. Ho
(74) *Attorney, Agent, or Firm*—Kenyon & Kenyon LLP

(57) ABSTRACT

A high-voltage MOS transistor having: a first region of a first conductivity type; a source region of the second conductivity type, which is introduced into the first region; a drain region of the second conductivity type, which is introduced into the first region; a channel region on the upper side of the first region, between the source region and the drain region; a field-oxide region in the drain region, between the source region and the drain region; a gate-oxide region over the channel region and between the edge of the drain region and the field-oxide region; a magnetoresistor region between the source region and the drain region, over the gate-oxide region and over at least a part of the field-oxide region; the drain region having a drain-terminal region and a drain-extension region and the doping profile of the drain-extension region is designed so that an avalanche breakdown occurs between the source region and the drain region, in a breakdown region that is on the edge of the drain-extension region and is not situated at the upper surface. Also it describes corresponding manufacturing methods.

12 Claims, 4 Drawing Sheets

PRIOR ART

HIGH-VOLTAGE MOS TRANSISTOR AND CORRESPONDING MANUFACTURING METHOD

FIELD OF THE INVENTION

The present invention relates to a high-voltage MOS transistor. The present invention also relates to a corresponding manufacturing method.

BACKGROUND INFORMATION

Although applicable to any high-voltage MOS transistor, the present invention and the problem forming the basis of it are explained with regard to high-voltage MOS transistors in CMOS technology, which are manufactured according to the SVX technique (Smart Voltage Extension).

High-voltage NMOS transistors and high-voltage PMOS transistors, which are manufactured in accordance with SVX technology, are known from IEEE Electron Device Letters, Vol. 21, No. 1, January, 2000, pages 40 to 42, C. Bassin, H. Ballan, and M. Declercq, "High-Voltage Device for 0.5-μm Standard CMOS Technology." FIG. 4 shows a high-voltage PMOS transistor known from this printed publication.

In FIG. 5, reference numeral 10 denotes a p-doped silicon semiconductor substrate. A deep n-well introduced into semiconductor substrate 10 is denoted by reference numeral 20. A p$^+$-drain region is denoted by reference numeral 30a, and a p-drain extension is denoted by 30b. Reference numeral 40 refers to a p$^+$-doped source region, 50 refers to a gate oxide, 60 refers to a magnetoresistor, which, on one hand, is used as a gate terminal and, on the other hand, is brought onto a LOCOS field-oxide region 70 for controlling the field. Reference numeral 80 denotes an n$^+$-region in the form of an additional well terminal for n-well 20.

The high-voltage PMOS transistor shown in FIG. 5 may be manufactured, using standard 1-μm CMOS technology and 0.5-μm CMOS technology. A corresponding high-voltage NMOS transistor is also described in this printed publication.

Such high-voltage MOS transistors can have avalanche breakdown voltages on the order of 50 Volts at a channel length of <2 μm. If the channel length is selected to be too small, then premature punch-through to the source occurs.

In the case of these known high-voltage transistors, the avalanche breakdown usually occurs in a disadvantageous manner in a region referred to as DB, at which gate oxide 50 and field oxide 70 meet. In particular, this causes the breakdown voltages to be unstable (walk out) and to drift as a function of loading (measuring conditions, wiring) and number of loadings. The change in the breakdown voltage is reversible and may be annealed out.

The main disadvantage of this effect is the lowering of the avalanche breakdown voltage below the value of the p-n junction that is theoretically and physically attainable. In addition, the breakdown voltage shows a strong temperature dependence, which constitutes a considerable disadvantage for applications having a large temperature range.

SUMMARY OF THE INVENTION

The high-voltage MOS transistor of the present invention, as well as the manufacturing method have the advantage that the avalanche breakdown is a volume breakdown and not a surface breakdown. The volume breakdown remains stable and produces an increased breakdown voltage, as well as an associated, expanded possible range of application. The temperature coefficient of the avalanche breakdown is also considerably less, which results in good manufacturability (high yield), since only a small processing amount is necessary. The idea forming the basis of the present invention is to specifically design the doping profile (net doping, penetration depth) so as to move the location of the avalanche breakdown away from the silicon surface, into the depth of the silicon semiconductor substrate.

According to a preferred refinement, the first region is a first well in a substrate of the second conductivity type.

According to a further, preferred refinement, the first region is a substrate of the first conductivity type.

A further, preferred refinement provides for the drain-terminal region to have a second well, and for the drain-extension region to have a third well, the third well being introduced into the first region and the second well being introduced into the third well. In the case of this configuration, the breakdown region is preferably in the vicinity of the bottom side of the third well.

According to a further preferred refinement, the drain terminal region has a second well (3a) and the drain-extension region has a third well (3b) and a fourth well (3c), the third well being introduced into the first region, the fourth well being introduced into the third well and into the first region, and the second well being introduced into the third well, and the fourth well forming at least one step at the bottom side of the third well. In this configuration, the breakdown region is preferably in the vicinity of the step of wells 3b, 3c.

A further, preferred refinement provides for the drain-terminal region to have a second well, and for the drain-extension region to have a third well, the third well being introduced into the first region and the second well being introduced into the third well. In the course of the process, the third well diffuses together from at least two partial wells, at least one recess being formed on the bottom side of the third well. In this configuration, the breakdown region is in the vicinity of the greatest doping gradient in the volume.

According to a further preferred refinement, the first conductivity type is the n-type and the second conductivity type is the p-type.

A further preferred refinement provides for the first conductivity type to be the p-type, and for the second conductivity type to be the n-type.

According to a further preferred refinement, two field-oxide regions and two source regions are provided, which are positioned essentially symmetrically with respect to a common drain region.

DETAILED DESCRIPTION

Figure 1:
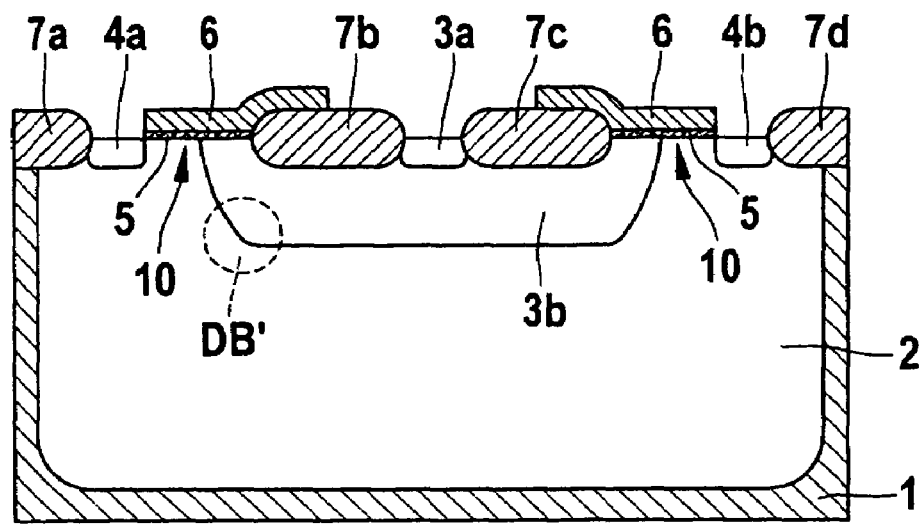
FIG. 1 shows a high-voltage MOS transistor according to a first specific embodiment of the present invention.

FIG. 1 shows a high-voltage MOS transistor according to a first specific embodiment of the present invention.

The high-voltage MOS transistor according to the first specific embodiment is a PMOS transistor integrated into a silicon p-semiconductor substrate 1, in which a first well 2 of the n-conductivity type is provided.

A strip-shaped drain region 3a, 3b of the p-conductivity type is introduced into first well 2, the drain region having a p$^+$-drain terminal region 3a and a p-drain expansion region 3b. Two strip-shaped source regions 4a, 4b of the p$^+$-conductivity type are introduced into first well 2 so as to be symmetric with respect to drain region 3a, 3b.

In each instance, a channel region 10 runs on the upper side of first well 2 between source region 4a or 4b and drain-extension region 3b. Field-oxide regions are designated by reference numerals 7a-d. Field-oxide regions 7b and 7c are situated on the upper side, in drain-extension region 3b, between drain-terminal region 3a and source regions 4a and 4b, respectively.

In each instance, a gate-oxide region 5 is situated above channel region 10 and on the upper side, between the edge of drain-extension region 3b and field-oxide region 7b or 7c. Magnetoresistor regions 6 extend between source region 4a or 4b and drain-terminal region 3a, over gate-oxide region 5 and over at least part of field-oxide regions 7b and 7c, respectively.

The doping profile (net doping, doping gradient) of drain-extension region 3b is designed so that an avalanche breakdown occurs between source region 4a or 4b and drain region 3a, 3b in a breakdown region DB' at the edge of drain-extension region 3b, near its bottom side, breakdown region DB' not being situated on the upper surface, i.e. a stable volume breakdown is present.

In practice, the doping profile may be ascertained by conventional simulations after determining the design of magnetoresistor regions 6. Generally speaking, desired breakdown region DB' is reached and the avalanche-breakdown voltage is accordingly increased, as the net doping of p-drain expansion region 3b is less than, and gradient is flatter than, in the case of the related art, whereby interaction of the doping profile with magnetoresistor 6 must be taken into consideration. Such p-doping prevents premature penetration of the electric field through drain-extension region 3b to p$^+$-terminal region 3a.

Figure 2:
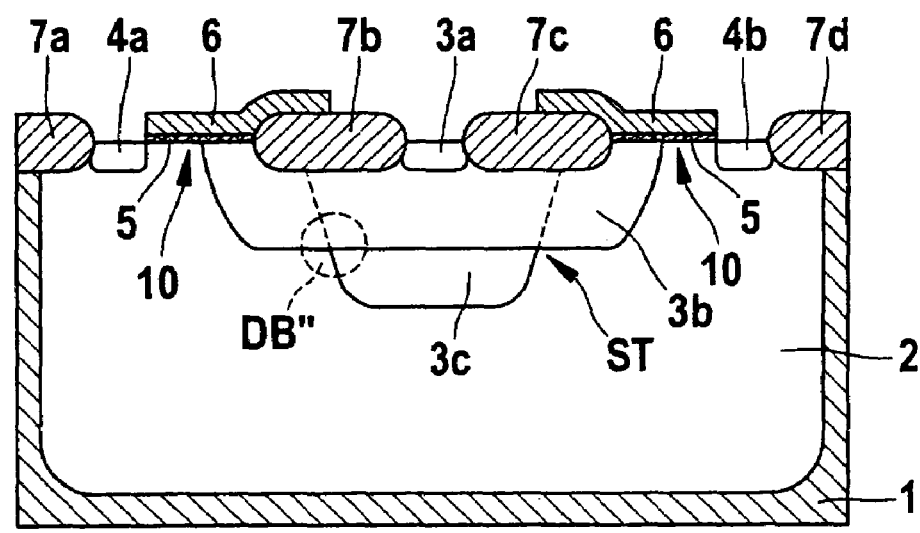
FIG. 2 shows a high-voltage MOS transistor according to a second specific embodiment of the present invention.

FIG. 2 shows a high-voltage MOS transistor according to a second specific embodiment of the present invention.

In contrast to the first specific embodiment, the second specific embodiment shown in FIG. 2 provides an additional p-drain expansion region 3c, which has the shape of a well that is laterally smaller than the well shape of drain-extension region 3b and forms a step ST on the bottom side of the well of p-drain expansion region 3b. In this specific embodiment, the location of the avalanche breakdown, which is designated by DB", is at step ST, i.e. further away from channel region 10 in the direction of the center of first p-drain expansion region 3b.

Figure 3A:
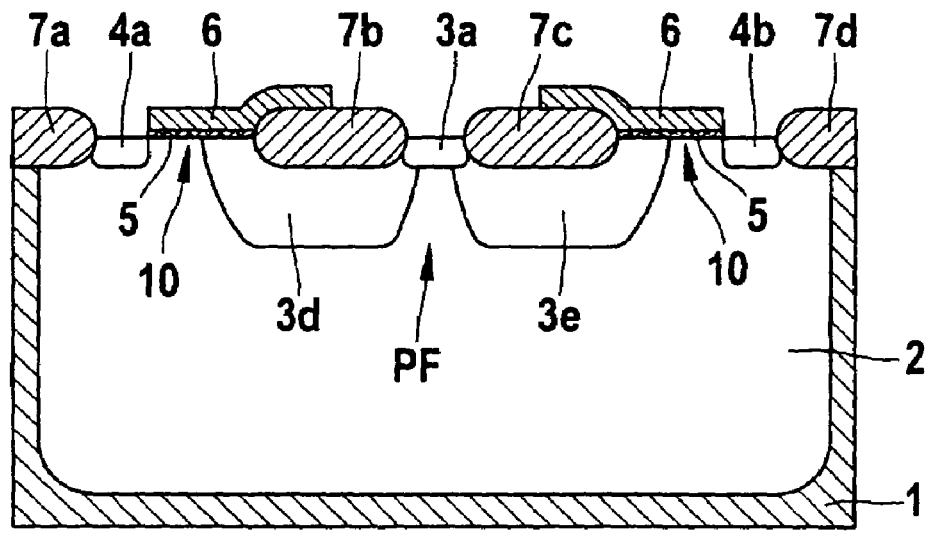
FIGS. 3a and 3b show a high-voltage MOS transistor in two manufacturing stages, according to a third specific embodiment of the present invention.
Figure 3B:
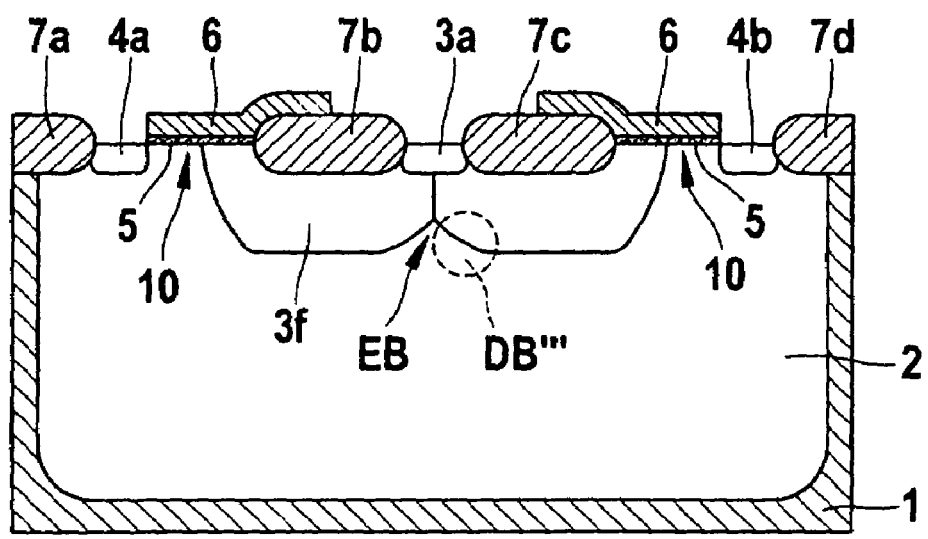

FIGS. 3a and b show a high-voltage MOS transistor in two production stages, according to a third specific embodiment of the present invention.

In the third specific embodiment according to FIG. 3a, two discrete p-drain expansion regions 3c, 3d are produced by corresponding implantations, the two discrete p-drain expansion regions having a perforation region PF with respect to p$^+$-drain terminal region 3a. In other words, p$^+$-drain terminal region 3a opens out into n-well 2 in this perforation region PF. Starting out from this process state shown in FIG. 3a, a thermal diffusion treatment then occurs which causes discrete drain-extension regions 3c, 3d to fuse below p$^+$-drain terminal region 3a.

In this specific embodiment, drain-extension region 3e resulting from it has an indentation EB below p$^+$-drain terminal region 3a, the indentation causing the location of the avalanche breakdown DB''' to be moved there, i.e. virtually below p$^+$-drain terminal region 3a, and to consequently be even further away from channel region 10.

Figure 4A:
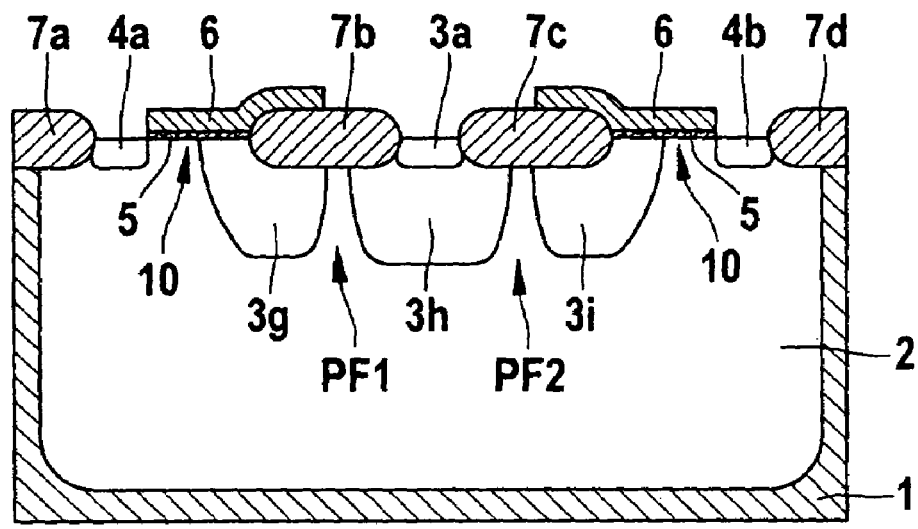
FIGS. 4a and 4b show a high-voltage MOS transistor in two manufacturing stages, according to a fourth specific embodiment of the present invention.
Figure 4B:
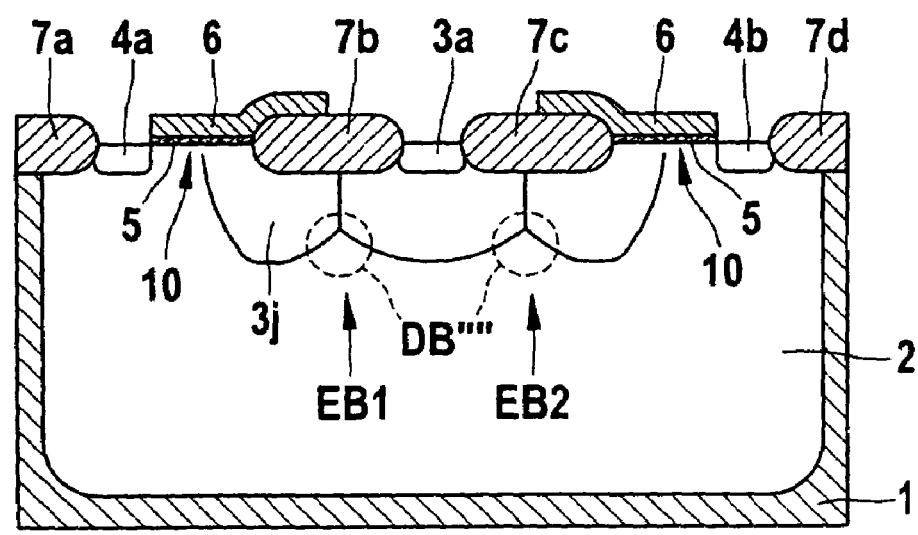
Figure 5:
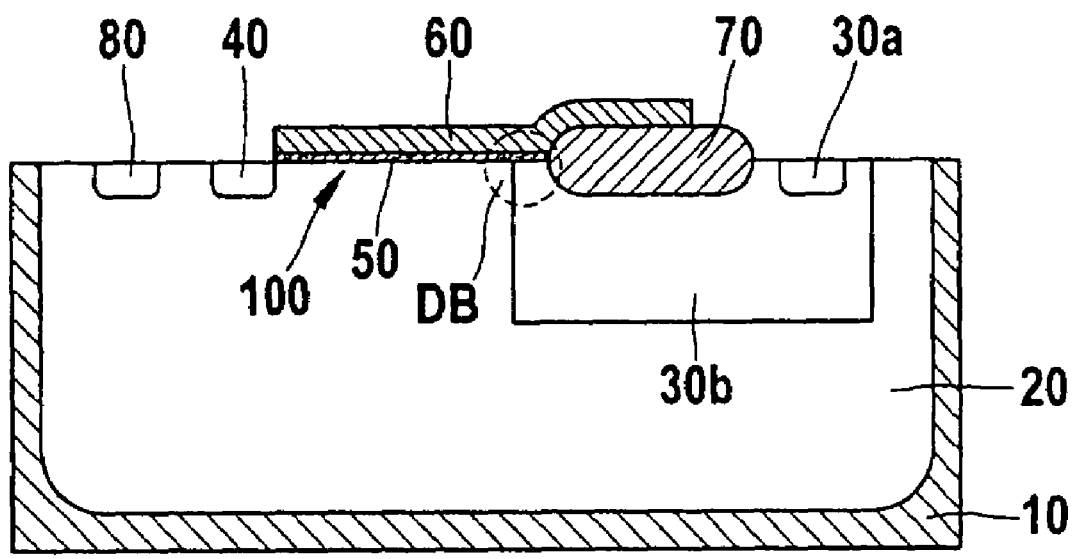
FIG. 5 shows a known high-voltage MOS transistor.

FIGS. 4a and b show a high-voltage MOS transistor in two production stages, according to a third specific embodiment of the present invention.

In contrast to the third specific embodiment, FIG. 4a provides for at least three discrete p-drain expansion regions 3g, 3h, 3i to be produced by corresponding implantations, the drain-extension regions having at least two perforation regions PF1, PF2.

Starting out from this process state shown in FIG. 4a, a thermal diffusion treatment then occurs which causes discrete drain-extension regions 3g, 3h, and 3i to fuse.

In this specific embodiment, drain-extension region 3j resulting from this has indentations EB1, EB2 below p$^+$-drain terminal region 3a, the indentations causing the location of avalanche breakdown DB'''' to be moved there, i.e. virtually below p$^+$-drain terminal region 3a, and to consequently be even further away from channel region 10.

Although the present invention was described above on the basis of preferred exemplary embodiments, it is not limited to them, but can be modified in various ways.

In particular, only symmetric, high-voltage PMOS transistors were described in the above-described specific embodiments, but the present invention is also applicable to high-voltage NMOS transistors and asymmetric, high-voltage PMOS transistors or high-voltage NMOS transistors.

LIST OF REFERENCE NUMERALS

1,10 p-silicon semiconductor substrate
2,20 n-well
3a, 30a p-well, drain-terminal region
3b; 3b, 3c;
3f,3g,3h,3i,3j;
30b p-well; drain-extension region
3d,3e p-partial wells
4a,4b,40 n-source regions
5, 50 gate oxide
6, 60 magnetoresistor
7a-d, 70 field-oxide regions
10, 100 channel region
DB,DB',
DB",DB'''
DB'''' breakdown region
ST step
EB,EB1,EB2 indentation
80 n-well terminal
PF,PF1,PF2 perforation region

What is claimed is:
1. A high-voltage MOS transistor, comprising:
a first region of a first conductivity type;
at least one source region of a second conductivity type and being introduced into the first region;
a drain region of the second conductivity type and being introduced into the first region;
a channel region on an upper side of the first region, between the at least one source region and the drain region;
at least one field-oxide region in the drain region between the at least one source region and the drain region;

a gate-oxide region located over the channel region and between an edge of the drain region and the at least one field-oxide region; and a magnetoresistor region located between the at least one source region and the drain region and above the gate-oxide region, and above at least part of the at least one field-oxide region, wherein:

the drain region includes a drain-terminal region and a drain-extension region, a doping profile of the drain-extension region is designed so that an avalanche breakdown occurs between the at least one source region and the drain region, in a breakdown region that is on an edge of the drain-extension region and is not situated at an upper surface.

2. The high-voltage MOS transistor as recited in claim 1, wherein the first region includes a first well in a substrate of the second conductivity type.

3. The high-voltage MOS transistor as recited in claim 1, wherein the first region includes a substrate of the first conductivity type.

4. The high-voltage MOS transistor as recited in claim 1, wherein:

the drain-terminal region includes a second well,
the drain-extension region includes a third well,
the third well is introduced into the first region, and
the second well is introduced into the third well.

5. The high-voltage MOS transistor as recited in claim 4, wherein the breakdown region is in a vicinity of a lower side of the third well.

6. The high-voltage MOS transistor as recited in claim 1, wherein:

the drain-terminal region includes a first well,
the drain-extension region includes a second well and a third well, the second well is introduced into the first region, the third well is introduced into the second well and into the first region, the first well is introduced into the second well, and
the third well forms at least one step at a lower side of the third well.

7. The high-voltage MOS transistor as recited in claim 6, wherein the breakdown region is situated in a vicinity of the step.

8. The high-voltage MOS transistor as recited claim 1, wherein:

the drain-terminal region includes a first well,
the drain-extension region includes a second well,
the second well is introduced into the first region,
the second well is introduced into the second well, and
at least one indentation is formed on a lower side of the second well.

9. The high-voltage MOS transistor as recited claim 8, wherein the breakdown region is situated in a vicinity of the at least one indentation.

10. The high-voltage MOS transistor as recited in claim 1, wherein:

the first conductivity type is n-type, and
the second conductivity type is the p-type.

11. The high-voltage MOS transistor as recited in claim 1, wherein:

the first conductivity type is p-type, and
the second conductivity type is n-type.

12. The high-voltage MOS transistor as recited in claim 1, wherein:

the at least one field-oxide region includes a plurality of field-oxide regions,
the at least one source region includes a plurality of source regions, and
the plurality of field-oxide regions and the plurality of source regions are positioned essentially symmetrically with respect to the drain region serving as a common drain region.

* * * * *